US011107784B2

(12) United States Patent
Maruyama et al.

(10) Patent No.: US 11,107,784 B2
(45) Date of Patent: Aug. 31, 2021

(54) SEMICONDUCTOR DEVICE HAVING CIRCUIT BOARD TO WHICH CONTACT PART IS BONDED

(71) Applicant: FUJI ELECTRIC CO., LTD., Kawasaki (JP)

(72) Inventors: Rikihiro Maruyama, Matsumoto (JP); Masaoki Miyakoshi, Matsumoto (JP); Masayuki Soutome, Matsumoto (JP); Kazuya Adachi, Hino (JP); Takeshi Yokoyama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/800,764

(22) Filed: Feb. 25, 2020

(65) Prior Publication Data

US 2020/0194392 A1    Jun. 18, 2020

Related U.S. Application Data

(63) Continuation of application No. PCT/JP2019/004050, filed on Feb. 5, 2019.

(30) Foreign Application Priority Data

Mar. 16, 2018  (JP) .............................. JP2018-049524

(51) Int. Cl.
*H01L 23/00* (2006.01)
(52) U.S. Cl.
CPC .............. *H01L 24/05* (2013.01); *H01L 24/45* (2013.01); *H01L 2224/03462* (2013.01);
(Continued)

(58) Field of Classification Search
CPC combination set(s) only.
See application file for complete search history.

(56) References Cited

U.S. PATENT DOCUMENTS 5,173,766 A * 12/1992 Long .................. H01L 21/50
257/687
7,245,500 B2 * 7/2007 Khan .................. H01L 23/13
174/255
(Continued)

FOREIGN PATENT DOCUMENTS

JP    2007-184315 A    7/2007
JP    2016-219554 A    12/2016
(Continued)

OTHER PUBLICATIONS

International Search Report for PCT/JP2019/004050, dated Apr. 23, 2019.
Written Opinion for PCT/JP2019/004050, dated Apr. 23, 2019.

*Primary Examiner* — Mamadou L Diallo
(74) *Attorney, Agent, or Firm* — Rabin & Berdo, P.C.

(57) ABSTRACT

A semiconductor device includes: a multilayer substrate which includes a circuit board and an insulating plate on which the circuit board is formed; and a contact part having a cylindrical hollow hole therein and an open end bonded to a bonding area on the front surface of the circuit board via bonding material. In the case of this semiconductor device, wettability of a contact area of the contact part with respect to the bonding material is approximately equal to wettability of at least the bonding area of the circuit board with respect to the bonding material. Thus, the rising of the bonding material into the hollow hole of the contact part during heating performed when the contact part is bonded to the circuit board is reduced.

14 Claims, 6 Drawing Sheets

(52) U.S. Cl.
CPC ............... *H01L 2924/01028* (2013.01); *H01L 2924/01029* (2013.01); *H01L 2924/052* (2013.01)

(56) References Cited

U.S. PATENT DOCUMENTS

| | | | |
|---|---|---|---|
| 8,586,420 B2 * | 11/2013 | Stolze | H01L 23/49811 |
| | | | 438/124 |
| 9,343,388 B2 * | 5/2016 | Terai | H01L 29/2003 |
| 9,640,453 B2 * | 5/2017 | Egusa | H01L 24/49 |
| 10,199,314 B2 * | 2/2019 | Kai | H01L 24/80 |
| 2009/0194884 A1 * | 8/2009 | Stolze | H05K 3/3426 |
| | | | 257/773 |
| 2010/0117219 A1 | 5/2010 | Oka et al. | |
| 2015/0340333 A1 * | 11/2015 | Isozaki | H01L 23/49811 |
| | | | 257/737 |
| 2016/0343647 A1 | 11/2016 | Kai et al. | |

FOREIGN PATENT DOCUMENTS

| | | |
|---|---|---|
| WO | 2008/090734 A1 | 7/2008 |
| WO | 2014/148319 A1 | 9/2014 |

* cited by examiner

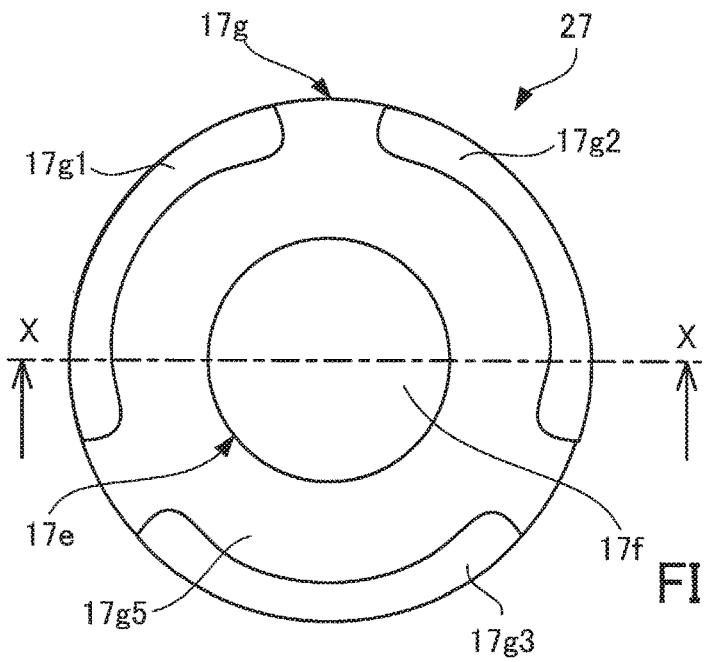
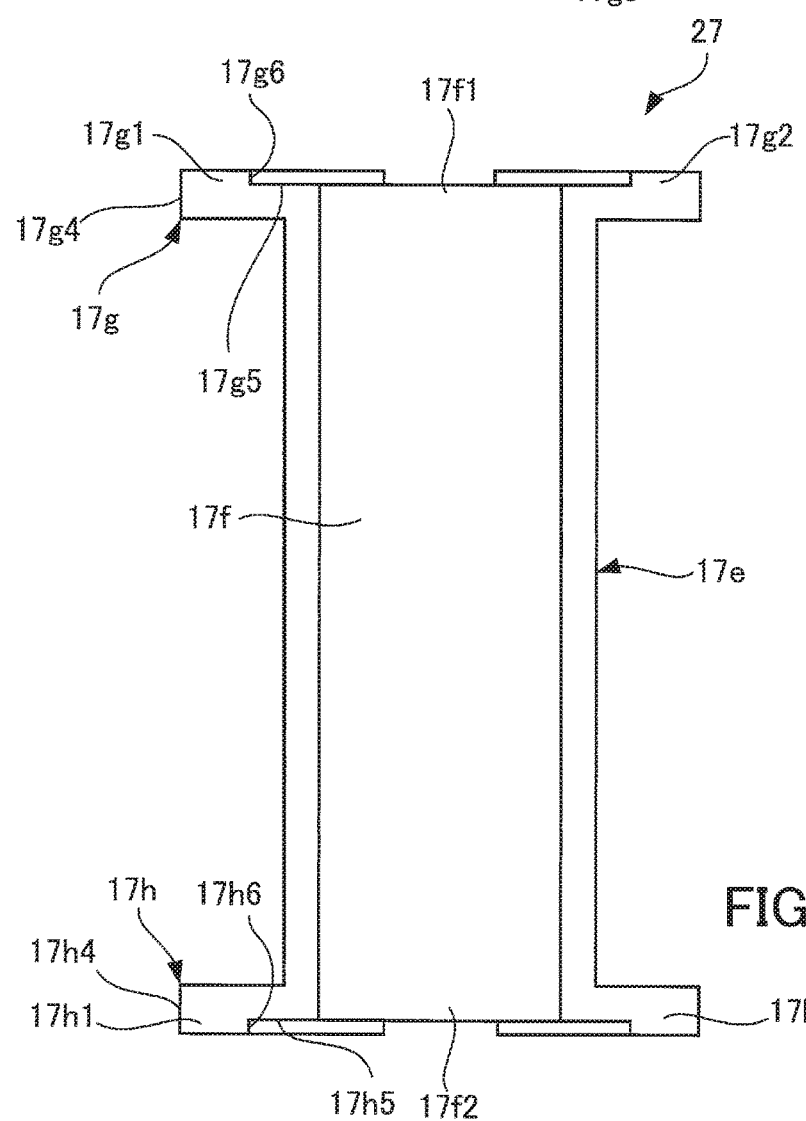
FIG. 5A
FIG. 5B

SEMICONDUCTOR DEVICE HAVING CIRCUIT BOARD TO WHICH CONTACT PART IS BONDED

CROSS-REFERENCE TO RELATED APPLICATION

This application is a continuation application of International Application PCT/JP2019/004050 filed on Feb. 5, 2019 which designated the U.S., which claims priority to Japanese Patent Application No. 2018-049524, filed on Mar. 16, 2018, the entire contents of which are incorporated herein by reference.

BACKGROUND OF THE INVENTION

1. Field of the Invention

The embodiments discussed herein relate to a semiconductor device.

2. Background of the Related Art

For example, semiconductor devices include semiconductor elements such as insulated gate bipolar transistors (IGBTs) or power metal-oxide-semiconductor field-effect transistors (MOSFETs). These semiconductor devices are used as power conversion devices, for example.

A semiconductor device includes a multilayer substrate including an insulating plate and circuit boards formed on the front surface of the insulating plate. Semiconductor elements and external connection terminals are arranged on the circuit boards, and signals applied from the external connection terminals are inputted to the semiconductor elements via the circuit boards.

For example, as discussed in International Publication Pamphlet No. 2014/148319, when such an external connection terminal is attached to a circuit board, a cylindrical contact part is used. The contact part is bonded to the circuit board via solder. The external connection terminal is pressed into the contact part and is electrically connected to the circuit board via the contact part.

However, if the amount of bonding material such as solder used for bonding the circuit board of the multilayer substrate and the contact part is small, the thickness of the bonding material is not ensured at the bonding portion. Thus, the bonding strength of the contact part with respect to the circuit board is reduced. If the bonding strength of the contact part with respect to the circuit board is reduced, the reliability of the semiconductor device could be deteriorated. If the amount of bonding material is large, the bonding material rises into a hollow hole of the contact part during heating performed when the contact part is bonded to the circuit board. If the bonding material rises into the hollow hole, the pressing of the external connection terminal is not performed. As a result, the reliability of the semiconductor device could be deteriorated.

SUMMARY OF THE INVENTION

According to an aspect, there is provided a semiconductor device including: a substrate including a circuit board and an insulating plate on which the circuit board is disposed; and a contact part having a cylindrical hollow hole therein, and open ends, one of the open ends being bonded to the circuit board in a bonding area of a front surface of the circuit board via a bonding material. A wettability of the contact part at a contact area contacting the bonding material with respect to the bonding material is approximately equal to a wettability of the circuit board at the bonding area with respect to the bonding material.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIGS. 5A and 5B illustrate a contact part according to a second embodiment.

DETAILED DESCRIPTION OF THE INVENTION

Hereinafter, embodiments will be described with reference to the accompanying drawings.

First Embodiment

Figure 1:
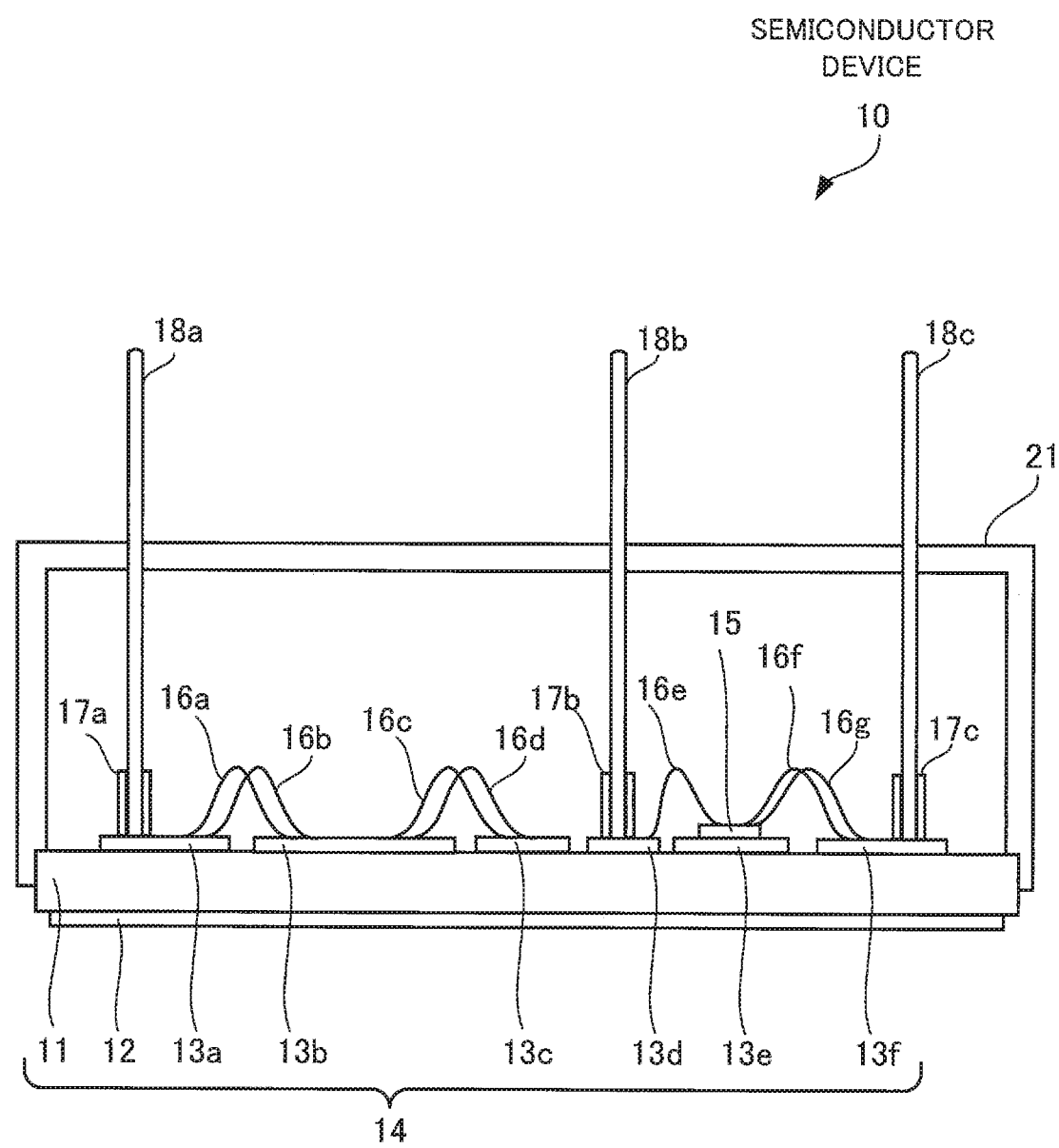
FIG. 1 is a sectional side view of a semiconductor device according to a first embodiment.

First, a semiconductor device according to a first embodiment will be described with reference to FIG. 1. FIG. is a sectional side view of a semiconductor device according to a first embodiment. As illustrated in FIG. 1, this semiconductor device 10 includes a multilayer substrate 14, semiconductor elements 15 and contact parts 17a to 17c arranged on the front surface of the multilayer substrate 14, and external connection terminals 18a to 18c attached to the contact parts 17a to 17c, respectively. The plurality of semiconductor elements 15 are arranged on the multilayer substrate 14 while only one of the semiconductor elements 15 is illustrated in FIG. 1. The semiconductor element 15 may be arranged at a different position other than the position illustrated in FIG. 1. A case 21 is bonded to the outer periphery of the multilayer substrate 14. Thus, the semiconductor elements 15, the contact parts 17a to 17c, the external connection terminals 18a to 18c, etc. are stored in the case 21. However, end parts of the external connection terminals 18a to 18c extend from inside the case 21 toward the outside of the case 21. The front surface of the semiconductor device 10 refers to the surface facing a direction toward which the end parts of the external connection terminals 18a to 18c extend out of the case 21. In addition, the rear surface of the semiconductor device 10 refers to the surface on which a cooler, which will be described below, is arranged. When circuit boards 13a to 13f, which will be described below, do not need to be distinguished from one another, each of the circuit boards 13a to 13f will be referred to as a circuit board 13. Likewise, when bonding wires 16a to 16g, which will be described below, do not need to be distinguished from one another, each of the bonding wires 16a to 16g will be referred to as a bonding wire 16. Likewise, when the external connection terminals 18a to 18c do not need to be distinguished from one another, each of the external connection terminals 18a to 18c will be referred to as an external connection terminal 18.

The multilayer substrate 14 includes an insulating plate 11, a metal plate 12 formed on the rear surface of the insulating plate 11, and the circuit boards 13 formed on the front surface of the insulating plate 11. The insulating plate 11 is made of ceramic material having high thermal conductivity, such as aluminum oxide, aluminum nitride, or silicon nitride having excellent thermal conductivity. The metal plate 12 is made of metal material such as copper, aluminum, iron, silver, or an alloy containing at least one kind of these elements having excellent thermal conductivity. The individual circuit board 13 is made of metal material such as copper or a copper alloy having excellent electrical conductivity. At least a part of the individual circuit board 13 is plated with second plating material. The plating of these circuit boards 13 with the second plating material will be described below. The thickness of the individual circuit board 13 is preferably 0.10 mm or more and 1.00 mm or less, more preferably 0.20 mm or more and 0.50 mm or less.

For example, a direct copper bonding (DCB) substrate or an active metal brazed (AMB) substrate may be used as the multilayer substrate 14 having the above structure. The multilayer substrate 14 conducts the heat generated by the semiconductor elements 15 to the external cooler via the circuit boards 13a to 13f, the insulating plate 11, and the metal plate 12. Bonding areas on which the contact parts 17a to 17c are bonded are set on the circuit boards 13a, 13d, and 13f. The bonding areas will be described below. A plurality of circuit boards 13 are formed on the insulating plate 11. Of all the plurality of circuit boards 13, FIG. 1 illustrates only the circuit boards 13a to 13f. When the contact parts 17a to 17c do not need to be distinguished from one another, each of the contact parts 17a to 17c will be referred to as a contact part 17.

The semiconductor elements 15 are bonded to their respective circuit boards 13 via bonding material (not illustrated). These semiconductor elements 15 are made of silicon or silicon carbide. For example, these semiconductor elements 15 include switching elements such as IGBTs or power MOSFETs. The individual semiconductor element 15 includes, for example, a drain electrode (or a collector electrode) on its rear surface and a gate electrode and a source electrode (or an emitter electrode) on its front surface. The individual semiconductor element 15 may include a diode such as a Schottky barrier diode (SBD) or a freewheeling diode (FWD), as needed. Such a semiconductor element 15 includes a cathode electrode on its rear surface and an anode electrode on its front surface. The rear surface of the individual semiconductor element 15 is bonded to a predetermined circuit board 13 via bonding material (not illustrated).

The individual contact part 17 is formed to have a cylindrical shape having a hollow hole that extends through open end parts. One of the open end parts is bonded to a circuit board 13 via bonding material (not illustrated) such as solder. An external connection terminal 18 is pressed through the other open end part. Alternatively, the individual contact part 17 may include a body part having a hollow hole and a flange formed at at least one of the open end parts of the body part. The individual contact part 17 is bonded to a corresponding circuit board 13 via bonding material (not illustrated) such as solder. The contact parts 17 are arranged on their respective circuit boards 13 of the multilayer substrate 14. Of all the contact parts 17, FIG. 1 illustrates only the contact parts 17 arranged on the circuit boards 13a, 13d, and 13f. The individual contact part 17 is made of copper, aluminum, iron, silver, or an alloy containing at least one kind of these elements having excellent conductivity. In addition, at least a part of the individual contact part 17 is plated with the first plating material. The plating of these contact parts 17 with the first plating material will be described below. The individual external connection terminal 18 is made of copper, aluminum, iron, silver, or an alloy containing at least one kind of these elements having excellent conductivity. The individual external connection terminal 18 is a rod-shaped terminal and has a square cross section, for example. The individual external connection terminal 18 is pressed into the hollow hole 17f of a corresponding contact part 17 and is electrically connected to the corresponding circuit board 13 via the corresponding contact part 17.

The circuit boards 13 on the multilayer substrate 14 are electrically connected to one another via the bonding wires 16. For example, the circuit boards 13a and 13b are electrically connected to one another via the bonding wires 16a and 16b, and the circuit boards 13b and 13c are electrically connected to one another via the bonding wires 16c and 16d. In addition, the circuit boards 13 and the semiconductor elements 15 are electrically connected to one another via the bonding wires 16. For example, the circuit board 13d and the semiconductor element 15 are electrically connected to one another via the bonding wire 16e. The circuit board 13f and the semiconductor element 15 are electrically connected to one another via the bonding wires 16f and 16g. In this way, in the semiconductor device 10, the circuit boards 13 are connected to one another via the bonding wires 16, and the circuit boards 13 and the semiconductor elements 15 are connected to one another via the bonding wires 16. In addition, the external connection terminals 18 are electrically connected to the circuit boards 13. As a result, certain circuits including the semiconductor elements 15 are configured. A heat radiation plate (not illustrated) may be attached to the rear surface of the metal plate 12 via solder, silver solder, or the like. The heat radiation plate in this case is made of, for example, copper, aluminum, iron, silver, or an alloy containing at least one kind of these elements having excellent thermal conductivity. In addition, for example, material such as nickel may be formed on the surface of the heat radiation plate by plating or the like, to improve the corrosion resistance. Specifically, other than nickel, a nickel-phosphorus alloy, a nickel-boron alloy, or the like may be formed. A cooler (not illustrated) may be attached to the rear side of the metal plate 12 or the heat radiation plate with a screw, etc., to improve the heat radiation performance. The cooler in this case is made of, for example, copper, aluminum, iron, silver, or an alloy containing at least one kind of these elements having excellent thermal conductivity. A heatsink, a water-cooling cooling device, or the like including a fin or a plurality of fins may be used as the cooler. The heat radiation plate may be formed integrally with the cooler. In this case, the heat radiation plate is made of copper, aluminum, iron, silver, or an alloy containing at least one kind of these elements having excellent thermal conductivity.

The case 21 is, for example, a box-like case and is made of thermoplastic resin. Examples of the resin include polyphenylenesulfide (PPS), polybutyleneterephthalate (PBT) resin, polybutylene succinate (PBS) resin, polyamide (PA)

resin, and acrylonitrile butadiene styrene (ABS) resin. The inside of the case 21 may be sealed with sealing material (not illustrated). The sealing material is made of, for example, thermoset resin such as silicon resin, maleimide-modified epoxy resin, maleimide-modified phenolic resin, or maleimide resin and filler. The sealing material may be made of gel such as silicon resin. The sealing material is injected into the case 21 through a predetermined inlet formed therein. The injected sealing material seals the multilayer substrate 14, the semiconductor elements 15, the contact parts 17, the bonding wires 16, and a part of the individual external connection terminal 18 on the heat radiation plate.

Figure 2A:
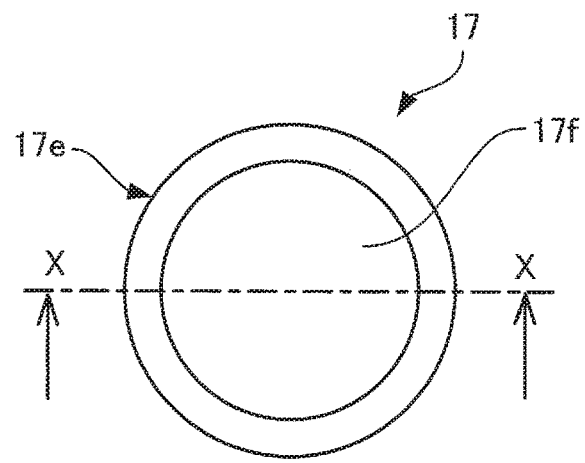
FIGS. 2A and 2B illustrate a contact part according to the first embodiment.
Figure 2B:
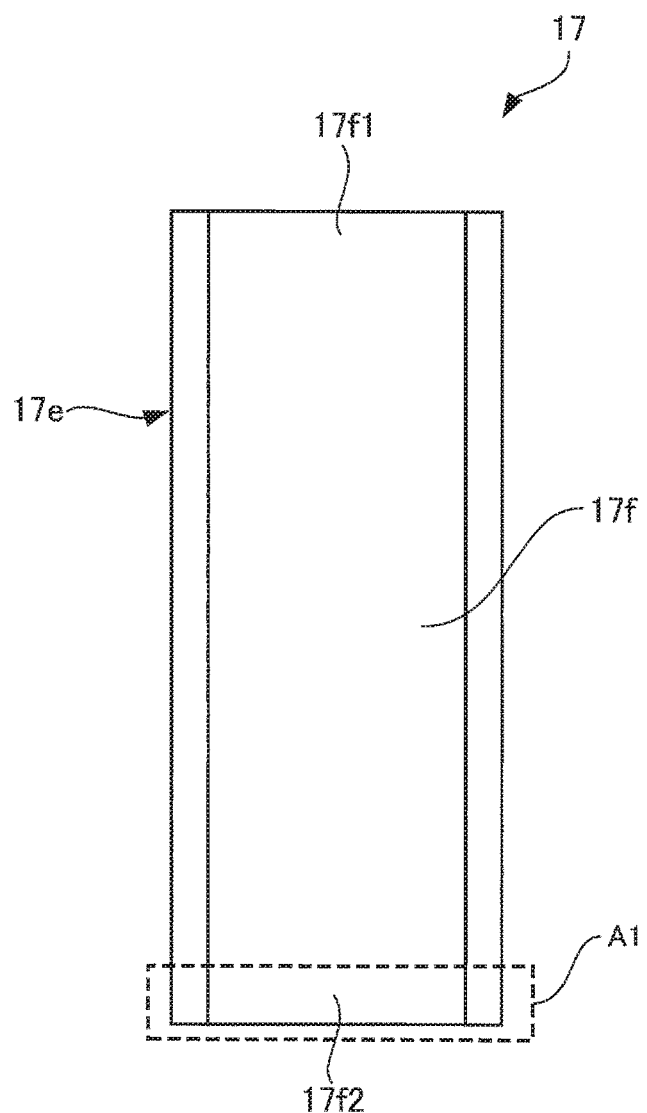

Next, an individual contact part 17 will be descried with reference to FIGS. 2A and 2B. FIGS. 2A and 2B illustrate a contact part according to the first embodiment. FIG. 2A is a plan view of a contact part 17, and FIG. 2B is a sectional view taken along an alternate long and short dash line X-X in FIG. 2A. The individual contact part 17 includes a body part 17e having a cylindrical hollow hole 17f, an open end part 17f1 on one end of the body part 17e, and an open end part 17f2 on the other end of the body part 17e. The open end part 17f2 (or the open end part 17f1) of the contact part 17 is bonded to a circuit board 13 via bonding material. In addition, an external connection terminal 18 is pressed into the open end part 17f1 (or the open end part 17f2) opposite to the open end part 17f2 (or the open end part 17f1) bonded to the circuit board 13. The first embodiment assumes that the open end part 17f2 of the contact part 17 is bonded to a circuit board 13 and that an external connection terminal 18 is pressed into the open end part 17f1. In addition, a contact area A1 is set at the open end part 17f2 of the contact part 17. The contact area A1 is an area to be brought into contact with the bonding material later. Plating has been performed on at least the contact area A1 of the contact part 17 with the first plating material (not illustrated). In the case of the contact part 17 having the above structure, the inner diameter of the open end parts 17f1 and 17f2 of the hollow hole 17f is preferably 0.20 mm or more and 2.00 mm or less, more preferably 0.50 mm or more and 1.50 mm or less. The outer diameter of the open end parts 17f1 and 17f2 of the contact part 17 preferably is 1.00 mm or more and 2.50 mm or less, more preferably 1.50 mm or more and 2.00 mm or less.

Figure 3:
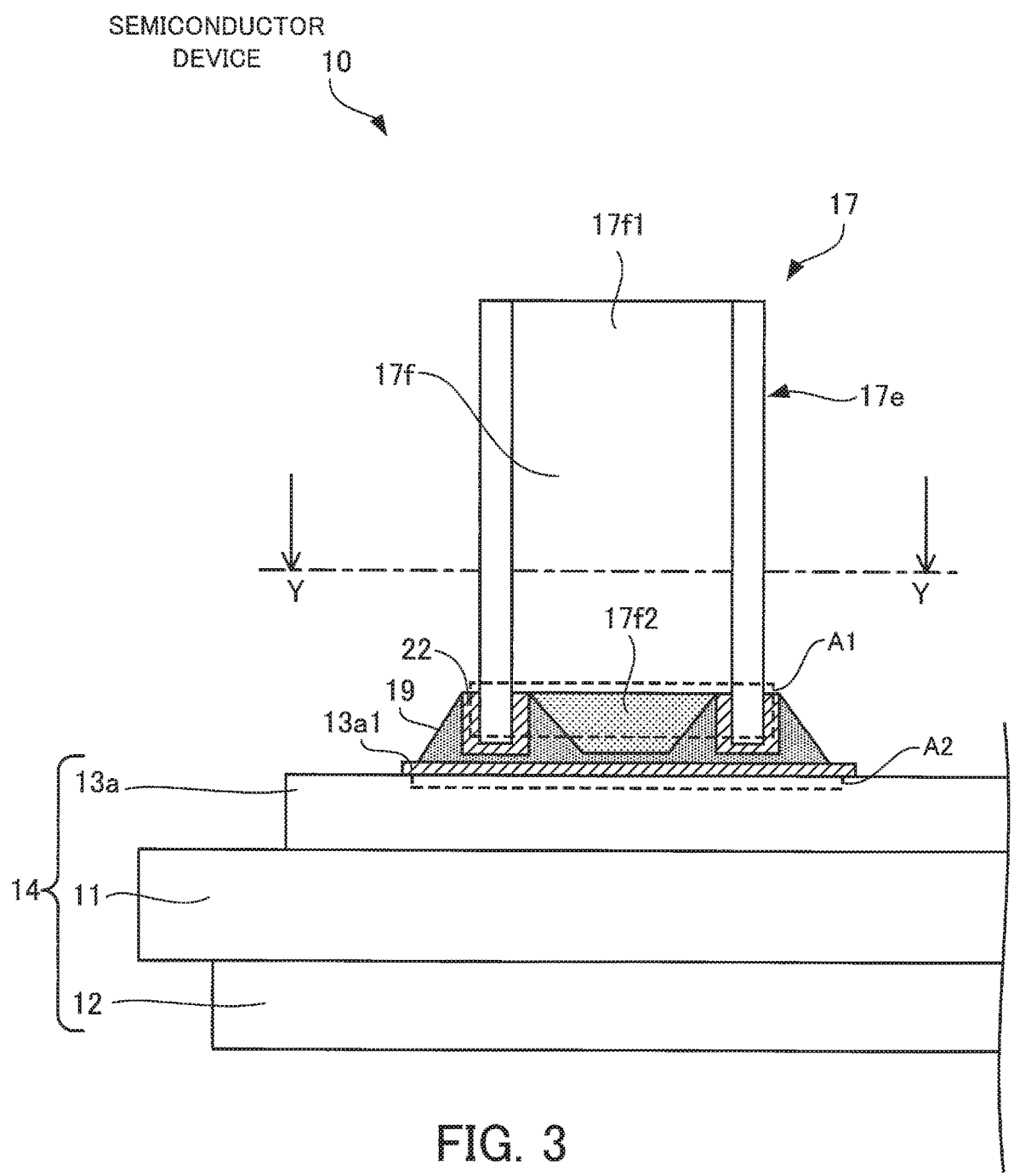
FIG. 3 is a sectional side view of a bonding portion of the contact part of the semiconductor device according to the first embodiment.
Figure 4:
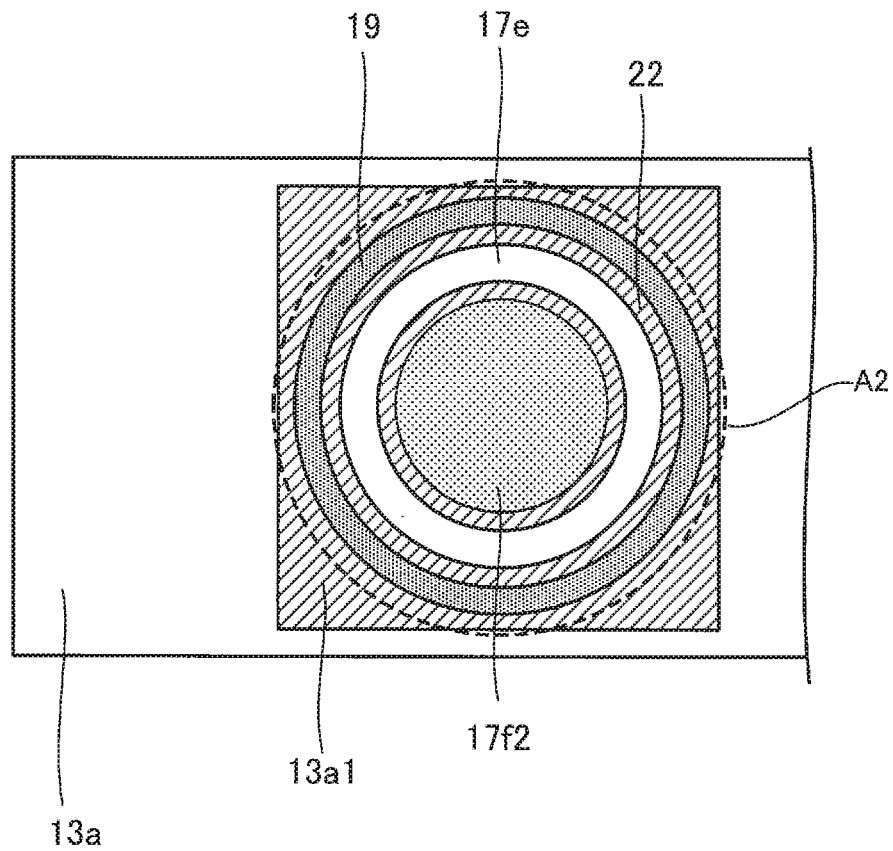
FIG. 4 is a plan view of a bonding area formed on a circuit board of the semiconductor device according to the first embodiment.

Next, the bonding portion of the contact part 17 with respect to a circuit board 13 of the multilayer substrate 14 will be described with reference to FIGS. 3 and 4. FIG. 3 is a sectional side view of the bonding part of the contact part of the semiconductor device according to the first embodiment. FIG. 3 illustrates the portion where the contact part 17 is bonded to the multilayer substrate 14. FIG. 4 is a plan view of the bonding area formed on the circuit board of the semiconductor device according to the first embodiment. FIG. 4 is a plan view of the bonding area, viewed from a cross section taken along an alternate long and short dash line Y-Y in FIG. 3. FIG. 4 illustrates the portion where the contact part 17 is bonded to the multilayer substrate 14, as in FIG. 3.

A bonding area A2 is set on the front surface of the circuit board 13a of the multilayer substrate 14. The bonding area A2 is an area of the circuit board 13a to which a corresponding contact part 17 is to be bonded. According to the first embodiment, plating has been performed on at least the bonding area A2 of this circuit board 13a with second plating material 13a1. At least the bonding area A2 of the circuit board 13a needs to be plated with the second plating material 13a1. Alternatively, the entire surface of the circuit board 13a may be plated with the second plating material 13a1. In addition, the bonding material 19 is applied to the second plating material 13a1 of the bonding area A2 of the circuit board 13. The bonding material 19 is made of solder. The bonding material 19 is preferably made of lead-free solder. Lead-free solder is, for example, tin-silver-copper solder, tin-zinc-bismuth solder, or tin-copper solder. Nickel, germanium, cobalt, or silicon may be added to the bonding material 19. The bonding area A2 is also set on each of the other circuit boards 13 to which their respective contact parts 17 are bonded, as is the case with the circuit board 13a. The second plating material 13a1 is formed on these bonding areas A2.

In contrast, as described above, the contact area A1 is set at the open end part 17f2 of the individual contact part 17. According to the first embodiment, at least the contact area A1 at the open end part 17f2 of the individual contact part 17 is plated with the first plating material 22. Any plating is applicable as long as the corresponding surface of the contact part 17 is covered by a metal film made of the first plating material 22. The first plating material 22 and the second plating material 13a1 are made of materials having approximately the same wettability with respect to the bonding material 19. The wettability with respect to the bonding material 19 is evaluated based on a solder spread ratio $S_r$ of the first plating material 22 with respect to the second plating material 13a1. Next, a measuring method of the solder spread ratio $S_r$ will be described.

First, test pieces obtained by forming various kinds of plating on the circuit board 13a of the multilayer substrate 14 and cream solder are prepared. Tin-silver-copper lead-free solder is used as the solder material. A certain amount of the cream solder is applied to the same area of each of the test pieces. The test pieces are heated to 250±3° C. for 30 seconds, to melt the solder. Next, the test pieces are naturally cooled to room temperature, and solder plane areas S are measured. The solder spread ratio $S_r$ is expressed by expression (1), which is the ratio of a solder plane area $S_1$ of the first plating material 22 when a solder plane area $S_2$ of the second plating material 13a1 is 100%.

$$S_r = \text{solder plane area } S_1 \text{ of first plating material/solder plane area } S_2 \text{ of second plating material} \times 100 \quad \text{Expression (1)}$$

The solder spread ratio $S_r$ of the materials having approximately the same wettability with respect to the bonding material 19 is preferably 90% or more and 110% or less, more preferably 95% or more and 105% or less. If the solder spread ratio $S_r$ is large, the solder rises inside the hollow hole 17f of the individual contact part 17. Thus, when an external connection terminal 18 is pressed into the hollow hole 17f, the rise of the solder may prevent the external connection terminal 18 from being properly inserted. For example, the external connection terminal 18 may be stuck halfway. In contrast, if the solder spread ratio $S_r$ is small, appropriate solder fillet is not formed at the contact part 17. Thus, when an external connection terminal 18 is pressed into the hollow hole 17f, appropriate bonding strength could not be obtained. For example, the contact part 17 could be detached from the circuit board 13a.

As the materials having approximately the same wettability with respect to the bonding material 19, the first plating material 22 is made of nickel or a nickel alloy, and the second plating material 13a1 is made of nickel or a nickel alloy. Preferably, the second plating material 13a1 is made of a nickel alloy containing phosphorus, and the first plating material 22 is made of nickel or a nickel alloy containing less phosphorus than that of the second plating material 13a1. In addition, preferably, the second plating material 13a1 is made of a nickel alloy containing phosphorus of 8 weight percent (wt %) or more and 10 wt % or less with respect to the entire second plating material 13a1. Elements, etc. of 1 wt % or less included in the first and second plating materials 22 and 13a1 as impurities are clearly distinguished from the materials of the first and second plating materials 22 and 13a1. In addition, metal material (for example, nickel) which is not "alloy" does not include any other elements than impurities. In this way, particularly when lead-free solder is applied, it is possible to improve the bonding strength of the contact part 17 with respect to the circuit board 13a while reducing the rising of the solder. The thickness of the first plating material 22 is preferably 1 μm or more and 20 μm or less, more preferably 3 μm or more and 7 μm or less. If the thickness of the plating material is excessively large, since the surface becomes hardened, the pressing of the external connection terminal 18 will be difficult. In addition, the external connection terminal 18 is detached more easily. In contrast, if the thickness of the plating material is excessively small, the advantageous effect of the plating to reduce the rising of the solder is not obtained. The thickness of the second plating material 13a1 is preferably 1 μm or more and 50 μm or less, more preferably 5 μm or more and 20 μm or less. It is not preferable to set an excessively large thickness for the plating material since the electrical resistance between the external connection terminal 18 and the circuit board 13 become large. In contrast, if the thickness for the plating material is excessively small, the advantageous effect of the plating to reduce the rising of the solder is not obtained.

Hereinafter, how the semiconductor device 10 is assembled will be described. The multilayer substrate 14 and the contact parts 17 described above are prepared. Next, the bonding area A2 of the circuit board 13 of the multilayer substrate 14 is plated with the second plating material 13a1, and the contact area A1 of the contact part 17 is plated with the first plating material 22. The plating may be performed by electroplating, non-electrolytic plating, hot dipping, thermal spraying, physical vapor deposition, chemical vapor deposition, or the like, depending on the plating materials. Next, the bonding material 19 is applied within the bonding area A2 on the second plating material 13a1 of the circuit board 13a of the multilayer substrate 14. Specifically, cream solder including flux is applied. The open end part 17f2 of the contact part 17 is arranged on the second plating material 13a1 in the bonding area A2 on which the bonding material 19 has been arranged, and the contact part 17 is pressed downward in FIG. 3.

Next, the multilayer substrate 14 on which the contact parts 17 have been arranged is heated to melt the bonding material 19. Next, the multilayer substrate 14 is cooled to room temperature to solidify the bonding material 19. The contact area A1 plated with the first plating material 22 on the contact part 17 is bonded to the bonding area A2 of the circuit board 13a plated with the second plating material 13a1 on the multilayer substrate 14 via the bonding material 19.

The above semiconductor device 10 includes the multilayer substrate 14 including the circuit boards 13 and the insulating plate 11 on which the circuit boards 13 are formed. The semiconductor device 10 further includes the contact parts 17, each of which has a cylindrical hollow hole 17f therein, and an open end part 17f2 bonded to the bonding area A2 on the front surface of the corresponding circuit board 13 via the bonding material 19. In the case of the semiconductor device 10, the wettability of the contact area A1 of a contact part 17 with respect to the bonding material 19 is approximately equal to the wettability of at least the bonding area A2 of a corresponding circuit board 13 with respect to the bonding material 19. Thus, the rising of the bonding material 19 into the hollow hole 17f of the contact part 17 is reduced during heating performed when the contact part 17 is bonded to the circuit board 13. As a result, the deterioration of the bonding strength of the contact part 17 with respect to the circuit board 13 of the multilayer substrate 14 is reduced. In addition, an external connection terminal 18 is pressed into the contact part 17 without fail. Thus, the deterioration of the reliability of the semiconductor device 10 is reduced.

Second Embodiment

A semiconductor device according to a second embodiment has the same structure as that of the semiconductor device 10 illustrated in FIG. 1. However, the plating areas of the first plating material and the second plating material of the semiconductor device according to the second embodiment are different from those of the semiconductor device 10 according to the first embodiment. In addition, specific materials are used as the first plating material, the second plating material, and the bonding material. In addition, contact parts that are different from those according to the first embodiment are used.

First, a contact part different from that according to the first embodiment will be described with reference to FIGS. 5A and 5B. FIGS. 5A and 5B illustrate a contact part according to the second embodiment. FIG. 5A is a plan view of an individual contact part 27. FIG. 5B is a sectional view taken along an alternate long and short dash line X-X in FIG. 5A. As in the semiconductor device 10 in FIG. 1, this semiconductor device includes a multilayer substrate 14 (a substrate), semiconductor elements 15 arranged on the front surface of the multilayer substrate 14, and external connection terminals 18. However, instead of the contact parts 17, this semiconductor device includes the contact parts 27 on the front surface of the multilayer substrate 14, and the external connection terminals 18 are attached to their respective contact parts 27.

As illustrated in FIGS. 5A and 5B, the individual contact part 27 has a body part 17e, a flange 17g arranged on an open end part 17f1 of the body part 17e, and a flange 17h arranged on an open end part 17f2 of the body part 17e. The flange 17h (or flange 17g) of the individual contact part 27 is bonded to a corresponding circuit board 13 by using solder, which is bonding material. In addition, an external connection terminal 18 is pressed into the flange 17g (or the flange 17h) opposite to the open end part bonded to the circuit board. While FIGS. 5A and 5B illustrate an example in which the flanges 17g and 17h are formed on the two respective open end parts 17f1 and 17f2, a flange may be formed on only one of the open end parts 17f1 and 17f2.

The body part 17e has a cylindrical shape in which a hollow hole 17f that extends through the open end parts 17f1 and 17f2 is formed. The flange 17g has a ring shape, and convex parts 17g1 to 17g3 are formed on three portions of the outer periphery. The thickness of the convex parts 17g1 to 17g3 of the flange 17g is larger than that of a bottom surface part 17g5. The thickness of a side end surface 17g4 along the outer periphery of the flange 17g is larger at the convex parts 17g1 to 17g3 than at the bottom surface part 17g5. A stepped part 17g6 is formed at the steps between the convex parts 17g1 to 17g3 and the bottom surface part 17g5. The height of the stepped part 17g6 is the difference between the thickness of the convex parts 17g1 to 17g3 and the thickness of the bottom surface part 17g5.

The flange 17h has the same structure as that of the flange 17g. Namely, the flange 17h has a ring shape, and convex parts (among which, only convex parts 17h1 and 17h2 are illustrated in FIG. 5B) are formed at three portions of the outer periphery of the flange 17h. Since the flange 17h has the convex parts 17h1 and 17h2, the thickness of the convex parts 17h1 and 17h2 is larger than that of a bottom surface part 17h5. Thus, the thickness of a side end surface 17h4 along the outer periphery of the flange 17h is larger at the convex parts 17h1 and 17h2 than at the bottom surface part 17h5. In addition, a stepped part 17h6 is formed at the steps between the convex parts 17h1 and 17h2 and the bottom surface part 17h5. The height of the stepped part 17h6 is the difference between the thickness of the convex parts 17h1 and 17h2 and the thickness of the bottom surface part 17h5. The convex parts 17g1 to 17g3 and 17h1 and 17h2 formed on the outer periphery of the flanges 17g and 17h ensure a certain thickness of solder that bonds the contact part 27 and the circuit board 13. Thus, better bonding strength between the circuit board 13 and the contact part 27 is maintained. In the case of this contact part 27, the inner diameter of the body part 17e is preferably 0.2 mm or more and 2.0 mm or less, more preferably 0.5 mm or more and 1.5 mm or less. The thickness of the convex parts 17g1 to 17g3 and 17h1 and 17h2 of the flanges 17g and 17h is preferably 0.05 mm or more and 0.30 mm or less, more preferably 0.10 mm or more and 0.20 mm or less.

Figure 6:
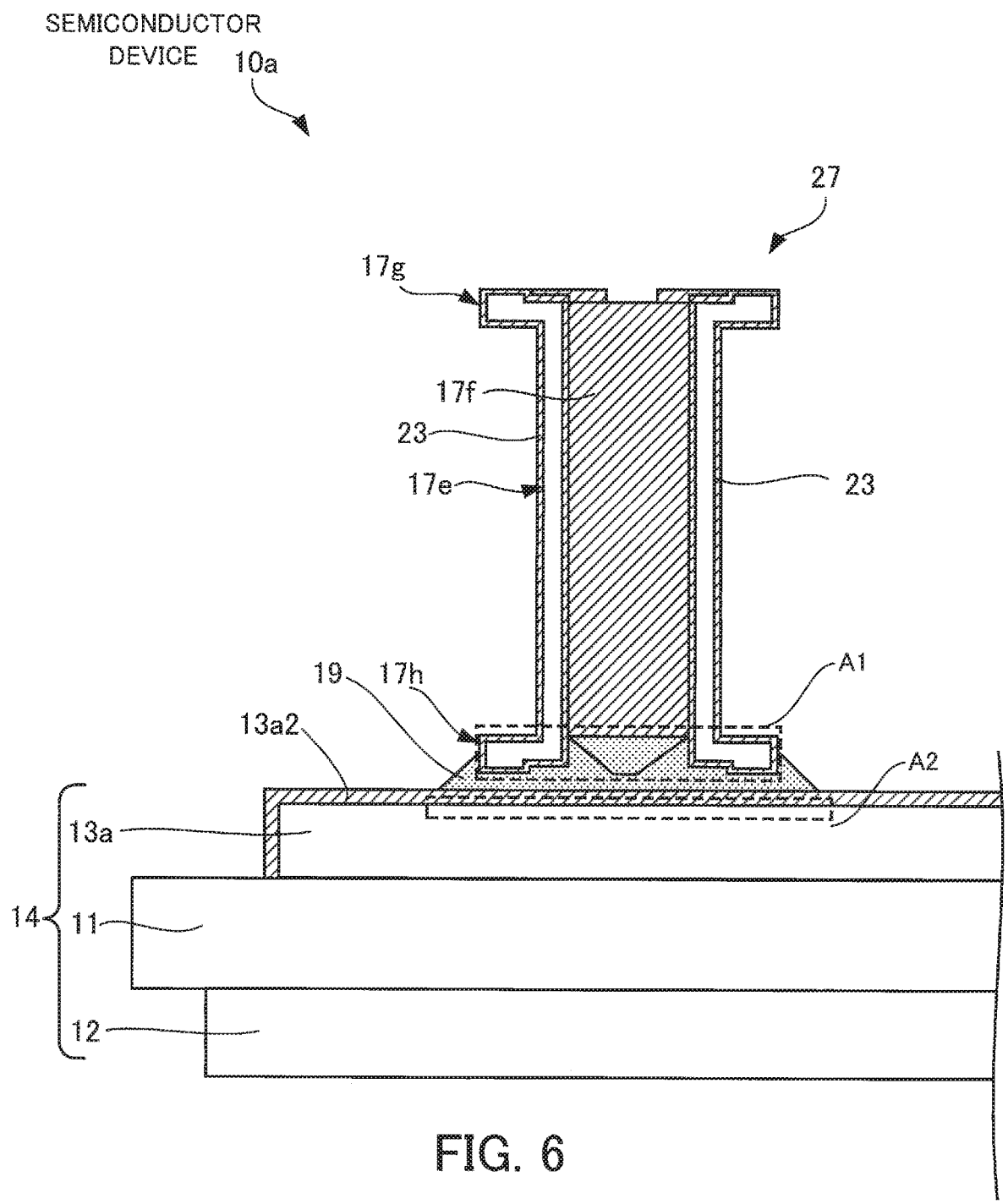
FIG. 6 is a sectional side view of a bonding portion of the contact part of a semiconductor device according to the second embodiment.

Next, the portion where the contact part 27 is bonded to the circuit board 13 of the multilayer substrate 14 of the semiconductor device 10a will be described with reference to FIG. 6. FIG. 6 is a sectional side view of the bonding portion of a contact part of the semiconductor device according to the second embodiment. As in FIG. 3 according to the first embodiment, FIG. 6 illustrates the portion where the circuit board 13a of the multilayer substrate 14 is formed. In the case of the semiconductor device 10a according to the second embodiment, the entire surface of each of the circuit boards 13 of the multilayer substrate 14 is plated with second plating material 13a2. The second plating material 13a2 is made of metal material such as nickel or gold or an alloy containing the metal material. For example, other than nickel and gold, the second plating material 13a2 may be made of a nickel-phosphorus alloy, a nickel-boron alloy, or the like. The circuit board 13 plated in this way has better corrosion resistance. The second plating material 13a2 according to the second embodiment is made of a nickel-phosphorus alloy whose phosphorus content is about 8 wt % or more and 10 wt % or less. Gold may be formed on the nickel-phosphorus alloy. The thickness of this second plating material 13a2 is preferably 1 μm or more and 50 μm or less, more preferably 5 μm or more and 20 μm or less. As in the first embodiment, the thickness of the circuit board 13a (except the thickness of the second plating material 13a2) is preferably 0.10 mm or more and 1.00 mm or less, more preferably 0.20 mm or more and 0.50 mm or less.

In addition, the entire surface of the individual contact part 27 including the contact area A1 is also plated with first plating material 23. The first plating material 23 is also made of metal material such as nickel or gold or an alloy containing the metal material. Any material whose wettability with respect to the bonding material 19 is approximately the same as that of the second plating material 13a2 may be used as the first plating material 23. The first plating material 23 according to the second embodiment is made of nickel that does not contain phosphorus or boron. If the thickness of the first plating material 23 with respect to the contact part 27 is excessively large, the pressing of an external connection terminal 18 will be difficult. In contrast, if the thickness of the first plating material 23 is excessively small, the advantageous effect of the plating is not achieved. In view of these points, the thickness of the first plating material 23 is preferably 1 μm or more and 20 μm or less, more preferably 3 μm or more and 7 μm or less. Thus, as in the second embodiment, the first plating material 23 of the contact part 27 and the second plating material 13a2 of the circuit board 13a have approximately the same wettability with respect to the bonding material 19.

Next, how the semiconductor device 10a according to the second embodiment is assembled will be described. As in the first embodiment, the multilayer substrate 14 and the contact parts 27 are prepared. The second plating material 13a2 on the entire surface of the individual circuit board 13 of the multilayer substrate 14 is formed by electroplating. The first plating material 23 on the entire surface of each of the contact parts 17 including the contact areas A1 is also formed by electroplating. Next, as in the first embodiment, the subsequent processing is performed. Namely, the bonding material 19 is applied within the bonding area A2 on the second plating material 13a2 of the circuit board 13a of the multilayer substrate 14. Specifically, cream solder containing flux is applied. The open end part 17f2 of the contact part 27 is arranged in the bonding area A2 of the second plating material 13a2 on which the bonding material 19 has been arranged, and the contact part 27 is pressed downward in FIG. 6.

Next, the multilayer substrate 14 on which the individual contact parts 27 are arranged is heated to melt the bonding material 19. Next, the multilayer substrate 14 is cooled to room temperature to solidify the bonding material 19. The contact area A1 of the contact part 27 plated with the first plating material 23 is bonded to the bonding area A2 of the circuit board 13a of the multilayer substrate 14, the circuit board 13a having been plated with the second plating material 13a2, via the bonding material 19. In this case, since the first plating material 23 of the contact part 27 and the second plating material 13a2 of the circuit board 13a contain nickel, the wettability of the first plating material 23 with respect to the bonding material 19 is approximately equal to that of the second plating material 13a2. Thus, the wettability of the contact area A1 of the contact part 27 with respect to the bonding material 19 is approximately equal to that of the bonding area A2 of the circuit board 13a. Thus, the rising of the bonding material 19 into the hollow hole 17f of the contact part 27 during heating performed when the contact part 27 is bonded to the circuit board 13a is reduced. In this way, the contact part 27 is firmly attached to the circuit board 13a of the multilayer substrate 14.

The above semiconductor device 10a includes the multilayer substrate 14 including the circuit boards 13 and the insulating plate 11 on which the circuit boards 13 are formed. In addition, the semiconductor device 10a includes the contact parts 27, each of which has a cylindrical hollow hole 17f therein, and an open end part 17f2 bonded to the bonding area A2 on the front surface of a circuit board 13 via the bonding material 19. In the case of the semiconductor device 10a, the wettability of the contact area A1 of the contact part 27 with respect to the bonding material 19 is approximately equal to that of at least the bonding area A2 of the circuit board 13. Thus, the rising of the bonding material 19 into the hollow hole 17f of the contact part 27 during heating performed when the contact part 27 is bonded to the circuit board 13 is reduced. As a result, the deterioration of the bonding strength of the contact part 27 with respect to the circuit board 13 of the multilayer substrate 14 is reduced. An external connection terminal 18 is pressed into the contact part 27 without fail. In addition, the contact part 27 is entirely plated with the first plating material 23. Thus, the external connection terminal 18 is easily pressed into the contact part 27, and the pressed external connection terminal 18 is not easily detached. In addition, the contact part 27 and the circuit board 13 are entirely plated with the first plating material 23 and the second plating material 13a2, respectively. Thus, the contact part 27 and the circuit board 13 have better corrosion resistance, and the electrical connection from the corresponding external connection terminal 18 to a semiconductor element 15 is not deteriorated easily. Thus, the deterioration of the reliability of the semiconductor device 10a is reduced.

The embodiments discussed herein achieve reduction of the rising of bonding material into hollow holes of contact parts and achieve bonding of external connection terminals to circuit boards without fail. Thus, the deterioration of the reliability of the semiconductor device is prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
    a substrate including a circuit board and an insulating plate on which the circuit board is disposed; and
    a contact part having a cylindrical hollow hole therein, and open ends, one of the open ends being bonded to the circuit board in a bonding area of a front surface of the circuit board via a bonding material, wherein
    a wettability of the contact part at a contact area A1 contacting the bonding material with respect to the bonding material is approximately equal to a wettability of the circuit board at the bonding area with respect to the bonding material,
    the contact part has a first plating provided at the contact area, and the circuit board has a second plating provided at the bonding area, and
    the first plating has a wettability approximately equal to a wettability of the second plating.

2. The semiconductor device according to claim 1, wherein the bonding material is made of solder, and a solder spread ratio of the first plating to the second plating is in a range of 90% and 110%.

3. The semiconductor device according to claim 1, wherein the bonding material is made of solder, and a solder spread ratio of a material of the first plating to a material of the second plating is in a range of 95% and 105%.

4. The semiconductor device according to claim 1, wherein the first plating and the second plating are made of nickel or a nickel alloy.

5. The semiconductor device according to claim 1, wherein the circuit board is made of copper or a copper alloy.

6. The semiconductor device according to claim 1, wherein the contact part is made of copper, aluminum, iron, silver, or an alloy containing at least one kind of these elements.

7. The semiconductor device according to claim 4, wherein the second plating is made of a nickel alloy containing phosphorus, and
    the first plating is made of nickel or a nickel alloy containing phosphorus, a content of which is less than a content of phosphorus of the second plating.

8. The semiconductor device according to claim 7, wherein the content of phosphorus of the second plating is in a range of 8 weight percent and 10 weight percent.

9. The semiconductor device according to claim 1, further comprising an external connection terminal pressed into the contact part.

10. The semiconductor device according to claim 1, wherein the bonding material is made of lead-free solder.

11. The semiconductor device according to claim 4, wherein the second plating is made of a nickel alloy containing phosphorus, and
    the first plating is made of nickel.

12. A semiconductor device, comprising:
    a substrate which includes a circuit board and an insulating plate on which the circuit board is formed; and
    a contact part having a cylindrical hollow hole therein, and open ends, one of the open ends being bonded to a bonding area on a front surface of the circuit board via a bonding material, the contact part having a first plating provided at a contact area thereof, wherein
    the circuit board has a second plating provided at the bonding area thereof, to which the contact part at the contract area is bonded via a bonding material,
    the second plating is made of a nickel alloy containing phosphorus, and
    the first plating is made of nickel or a nickel alloy containing phosphorus, a phosphorus content of a material of the first plating being less than a phosphorus content of a material of the second plating.

13. The semiconductor device according to claim 12, wherein the phosphorus content of the material of the second plating is in a range of 8 weight percent and 10 weight percent.

14. The semiconductor device according to claim 12, wherein the first plating is made of nickel.

* * * * *